United States Patent
Lim

(10) Patent No.: US 10,516,070 B2
(45) Date of Patent: Dec. 24, 2019

(54) SOLAR CELL MODULE

(71) Applicant: LG ELECTRONICS INC., Seoul (KR)

(72) Inventor: Chunghyun Lim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 136 days.

(21) Appl. No.: 15/204,622

(22) Filed: Jul. 7, 2016

(65) Prior Publication Data

US 2017/0012156 A1    Jan. 12, 2017

(30) Foreign Application Priority Data

Jul. 8, 2015 (KR) .................. 10-2015-0096930

(51) Int. Cl.
*H01L 31/049* (2014.01)
*H01L 31/0745* (2012.01)
*H01L 31/05* (2014.01)
*H01L 31/068* (2012.01)
*H01L 31/0224* (2006.01)
*H01L 31/048* (2014.01)

(52) U.S. Cl.
CPC .. *H01L 31/0516* (2013.01); *H01L 31/022441* (2013.01); *H01L 31/049* (2014.12); *H01L 31/0481* (2013.01); *H01L 31/0512* (2013.01); *H01L 31/0682* (2013.01); *H01L 31/0745* (2013.01); *Y02E 10/547* (2013.01)

(58) Field of Classification Search
CPC .................................................. H01L 31/0516
See application file for complete search history.

(56) References Cited

U.S. PATENT DOCUMENTS

| 2010/0031999 | A1 | 2/2010 | Mishima et al. |
| 2011/0126878 | A1 | 6/2011 | Hacke et al. |
| 2011/0171372 | A1* | 7/2011 | Shearer ............... B22F 3/10 427/123 |
| 2012/0167978 | A1* | 7/2012 | Shin ............... H01L 31/022441 136/256 |
| 2013/0240022 | A1* | 9/2013 | Sewell ............ H01L 31/022441 136/251 |

(Continued)

FOREIGN PATENT DOCUMENTS

| EP | 2 869 350 A1 | 5/2015 |
| EP | 2 879 188 A1 | 6/2015 |

(Continued)

*Primary Examiner* — Tae-Sik Kang
(74) *Attorney, Agent, or Firm* — Birch, Stewart, Kolasch & Birch, LLP

(57) ABSTRACT

A solar cell module includes a plurality of solar cells, each solar cell including a semiconductor substrate, an emitter region, a back surface field region a first electrode connected to the emitter region, a second electrode connected to the back surface field region, and a conductive line connected to one electrode of the first and second electrodes using a conductive adhesive and insulated from the other electrode of the first and second electrodes through an insulating layer, the conductive line being used to connect a plurality of solar cells in series. A thickness of the conductive adhesive between the one electrode and the conductive line is greater than a thickness of the insulating layer between the other electrode and the conductive line.

18 Claims, 8 Drawing Sheets

(56) References Cited

U.S. PATENT DOCUMENTS

2013/0240023 A1  9/2013  Sewell et al.
2014/0124027 A1* 5/2014  Teshima .............. H01L 31/0504
                                                    136/256

FOREIGN PATENT DOCUMENTS

| JP | 2008-205137 A | 9/2008 |
| JP | 2009-206366 A | 9/2009 |
| JP | 2010-41012 A | 2/2010 |
| JP | 2011-3724 A | 1/2011 |
| JP | 2011-66071 A | 3/2011 |
| JP | 2012-99565 A | 5/2012 |
| JP | WO2013/015329 A1 | 1/2013 |
| JP | 2013-157602 A | 8/2013 |
| JP | 2015-512563 A | 4/2015 |
| JP | 2015-88755 A | 5/2015 |
| KR | 10-2014-0015247 A | 2/2014 |
| KR | 10-2014-0075969 A | 6/2014 |
| WO | WO 2014/077688 A1 | 5/2014 |

* cited by examiner

SOLAR CELL MODULE

CROSS-REFERENCE TO RELATED APPLICATION

This application claims priority to and the benefit of Korean Patent Application No. 10-2015-0096930 filed in the Korean Intellectual Property Office on Jul. 8, 2015, the entire contents of which are incorporated herein by reference.

BACKGROUND OF THE INVENTION

Field of the Invention

The present disclosure relates to a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through interconnectors to form a module.

SUMMARY OF THE INVENTION

In one aspect, there is provided a solar cell module including a plurality of solar cells, each solar cell including a semiconductor substrate doped with impurities of a first conductive type, an emitter region doped with impurities of a second conductive type opposite the first conductive type, a back surface field region more heavily doped than the semiconductor substrate with impurities of the first conductive type, a first electrode connected to the emitter region, a second electrode connected to the back surface field region, and a conductive line connected to one electrode of the first electrode and the second electrode using a conductive adhesive and insulated from the other electrode of the first electrode and the second electrode through an insulating layer, the conductive line being used to connect the plurality of solar cells in series, wherein a thickness of the conductive adhesive between the one electrode and the conductive line is greater than a thickness of the insulating layer between the other electrode and the conductive line.

The insulating layer and the conductive line may be separated from each other by a separation space.

An encapsulant may be positioned in the separation space between the insulating layer and the conductive line and may protect the semiconductor substrate from an external impact.

The insulating layer may include at least one of epoxy, polyimide, or silicone. In this instance, a material of the encapsulant may be different from a material of the insulating layer.

For example, the encapsulant may include ethylene vinyl acetate (EVA).

A material of the conductive adhesive may include tin (Sn). The conductive adhesive may include one of a solder paste, an epoxy solder paste, and a conductive paste.

Each of the first and second electrodes may include a metal material different from the conductive adhesive.

For example, each of the first and second electrodes may be formed as at least one layer including at least one of titanium (Ti), silver (Ag), aluminum (Al), nickel-vanadium (NiV) alloy, nickel (Ni), nickel-aluminum (NixAly) alloy, molybdenum (Mo), and tin (Sn).

The conductive line may include a core including at least one of copper (Cu) and aluminum (Al), and a coating layer coated on a surface of the core, the coating layer including tin (Sn).

For example, the coating layer may include at least one of SnPb, SnAgCu, SnBiAg, SnBi, Sn, and SnAg. A thickness of the core may be 50 μm to 250 μm, and a thickness of the coating layer may be 1 μm to 30 μm.

A thickness of the conductive adhesive may be 10 μm to 100 μm, and a thickness of the insulating layer may be 1 μm to 50 μm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
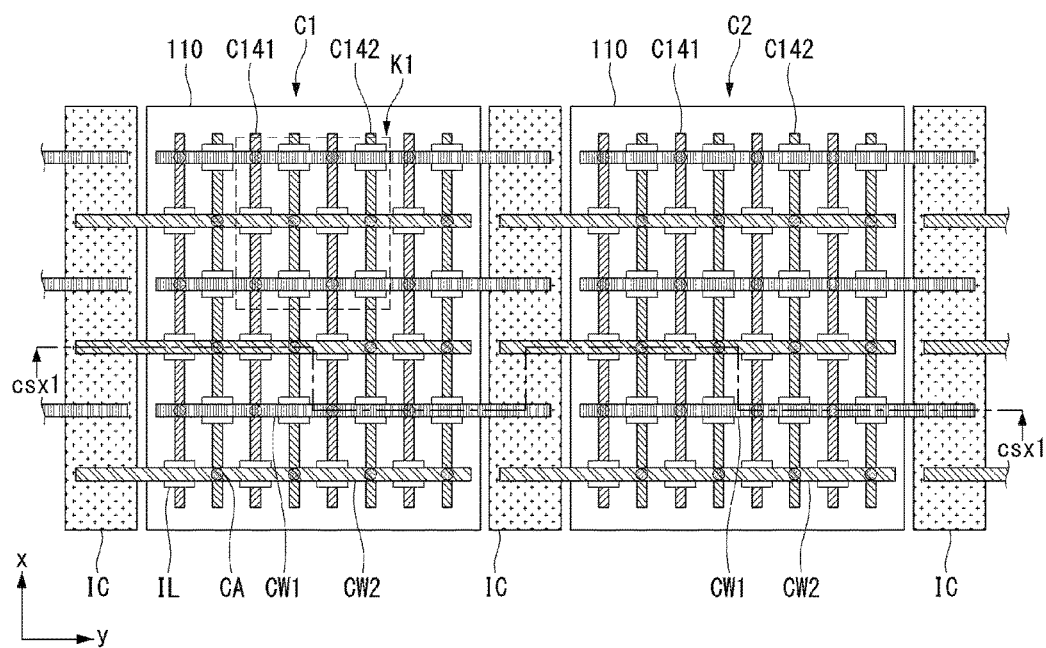
FIG. 1 illustrates an example of a string applied to a solar cell module according to an embodiment of the invention when viewed from a back surface side.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

FIGS. 1 to 6 illustrate an example of a solar cell module according to an embodiment of the invention.

FIG. 1 illustrates an example of a string applied to a solar cell module according to an embodiment of the invention when viewed from a back surface side.

As shown in FIG. 1, a solar cell module according to an embodiment of the invention includes a plurality of solar cells C1 and C2, a plurality of first and second conductive lines CW1 and CW2 connected to a plurality of first and second electrodes C141 and C142 formed on a back surface of each of the plurality of solar cells C1 and C2, and an intercell connector IC that is connected to the plurality of first and second conductive lines CW1 and CW2 and connects the plurality of solar cells C1 and C2 in series.

In the embodiment disclosed herein, each of the plurality of solar cells C1 and C2 includes a semiconductor substrate 110 and the plurality of first and second electrodes C141 and C142 that are separated from each other on a back surface of the semiconductor substrate 110 and extend in a first direction x.

The plurality of conductive lines CW1 and CW2 may electrically connect a plurality of first electrodes C141 included in one solar cell of two adjacent solar cells among a plurality of solar cells to a plurality of second electrodes C142 included in the other solar cell in series.

To this end, the plurality of conductive lines CW1 and CW2 may extend in a second direction y crossing a longitudinal direction (i.e., the first direction x) of the first and second electrodes C141 and C142 and may be connected to each of the plurality of solar cells.

For example, the plurality of conductive lines CW1 and CW2 may include a plurality of first conductive lines CW1 and a plurality of second conductive lines CW2. As shown in FIG. 1, the first conductive line CW1 may be connected to the first electrode C141 included in each solar cell using a conductive adhesive CA and may be insulated from the second electrode C142 of each solar cell through an insulating layer IL formed of an insulating material.

Further, the second conductive line CW2 may be connected to the second electrode C142 included in each solar cell using a conductive adhesive CA and may be insulated from the first electrode C141 of each solar cell through an insulating layer IL formed of an insulating material.

Each of the first and second conductive lines CW1 and CW2 may be connected to the intercell connector IC that is disposed between the plurality of solar cells and extends in the first direction x. Hence, the plurality of solar cells may be connected in series to each other in the second direction y.

Each of the first and second conductive lines CW1 and CW2 may have a conductive wire shape having a circular cross section or a ribbon shape, in which a width is greater than a thickness.

For example, when the first and second conductive lines CW1 and CW2 have the ribbon shape, a width of each of the first and second conductive lines CW1 and CW2 may be 0.5 mm to 2.5 mm in consideration of a reduction in the manufacturing cost while maintaining a line resistance of the conductive line at a sufficiently low level, and a thickness thereof may be 0.05 mm to 0.5 mm.

A distance between the first and second conductive lines CW1 and CW2 may be 4 mm to 6.5 mm in consideration of the total number of first and second conductive lines CW1 and CW2, so that a short circuit current of the solar cell module is not damaged.

FIG. 1 shows that the three first conductive lines CW1 and the three second conductive lines CW2 are used, as an example. However, the number of each of the first and second conductive lines CW1 and CW2 connected to one solar cell may be ten to twenty. Thus, the total number of first and second conductive lines CW1 and CW2 connected to one solar cell may be twenty to forty.

In the solar cell module according to the embodiment of the invention, a thickness of the conductive adhesive CA between one electrode and the conductive line may be greater than a thickness of the insulating layer IL between another electrode and the conductive line.

Hence, short circuit, in which some of the plurality of conductive lines CW1 and CW2 are not connected to electrodes, to which some conductive lines have to be electrically connected, can be previously prevented. Hence, a defect rate of the solar cell module can be reduced. This is described in detail later.

The embodiment of the invention is illustrated and described using an example where the solar cell module according to the embodiment of the invention includes the intercell connector. However, the intercell connector may be omitted. When the intercell connector is omitted, the first and second conductive lines CW1 and CW2 may be directly connected to each other or may be formed as one body, thereby connecting the plurality solar cells in series.

Each of the plurality of solar cells is described in detail below.

Figure 2:
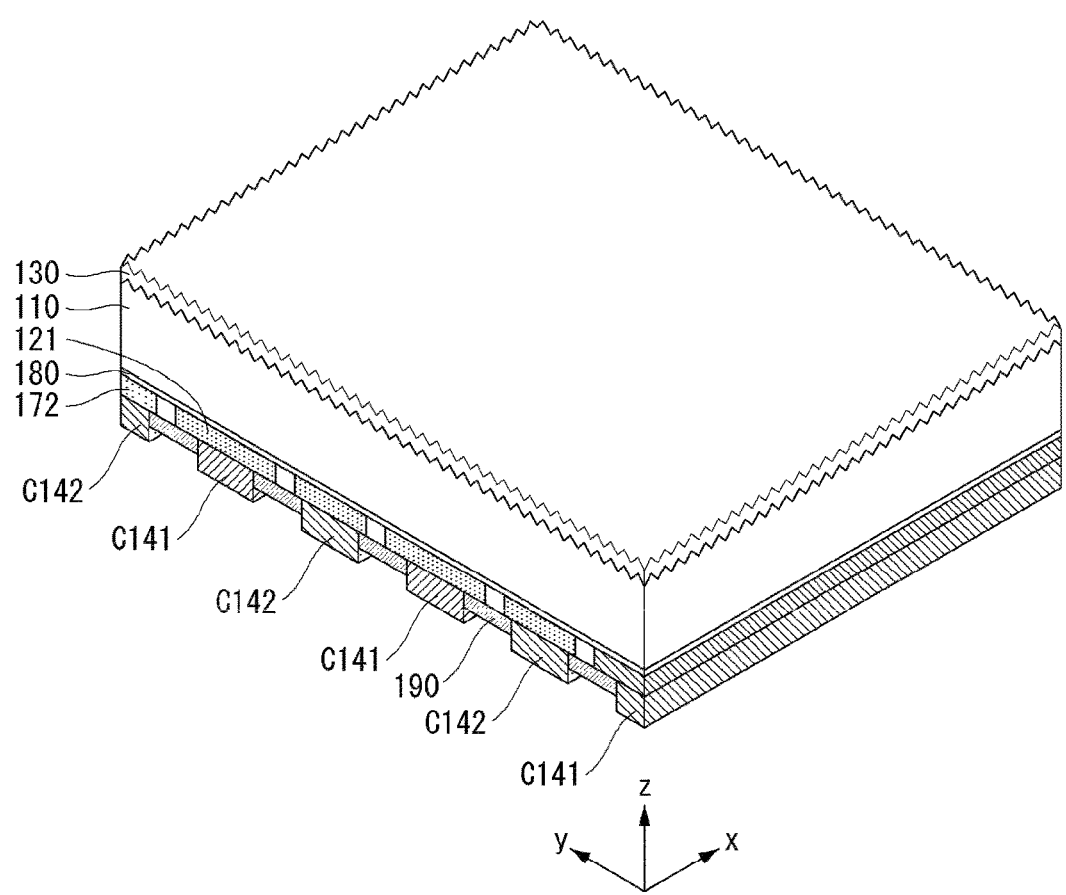
FIG. 2 is a partial perspective view illustrating an example of a solar cell applied to a solar cell module shown in FIG. 1.
Figure 3:
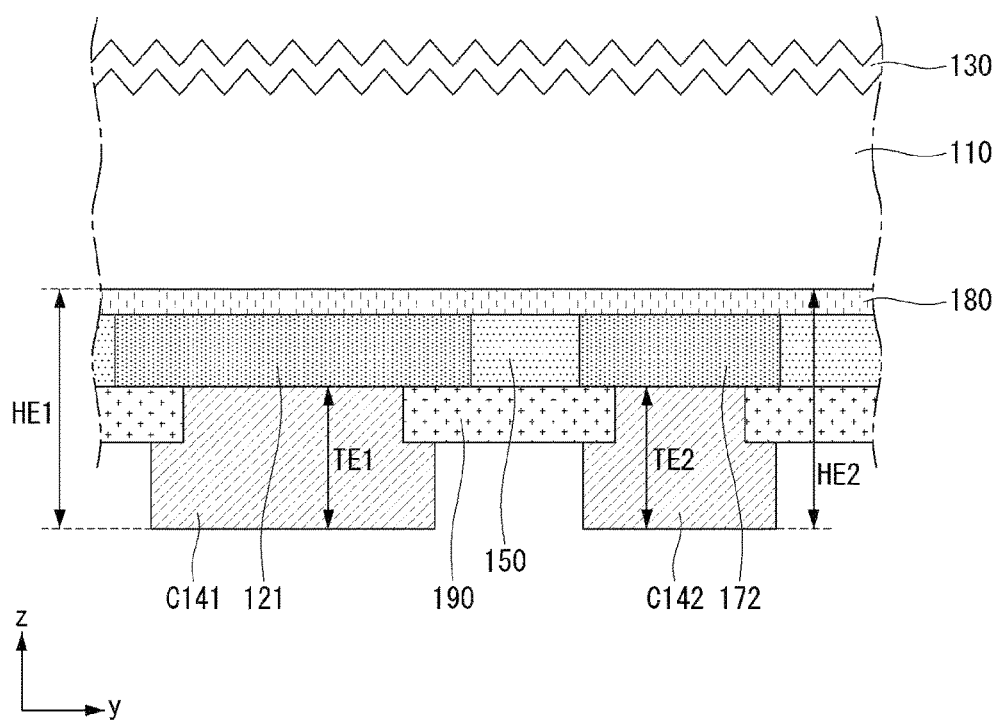
FIG. 3 is a cross-sectional view of a solar cell shown in FIG. 2 in a second direction.

FIG. 2 is a partial perspective view illustrating an example of a solar cell applied to the solar cell module shown in FIG. 1, and FIG. 3 is a cross-sectional view of a solar cell shown in FIG. 2 in a second direction.

As shown in FIGS. 2 and 3, a solar cell according to the embodiment of the invention may include an anti-reflection layer 130, a semiconductor substrate 110, a tunnel layer 180, a plurality of emitter regions 121, a plurality of back surface field regions 172, a plurality of intrinsic semiconductor layers 150, a passivation layer 190, a plurality of first electrodes C141, and a plurality of second electrodes C142.

In the embodiment disclosed herein, the anti-reflection layer 130, the intrinsic semiconductor layer 150, the tunnel layer 180, and the passivation layer 190 may be omitted, if desired or necessary. However, when the solar cell includes them, efficiency of the solar cell may be further improved. Thus, the embodiment of the invention is described using the solar cell including the anti-reflection layer 130, the intrinsic semiconductor layer 150, the tunnel layer 180, and the passivation layer 190, as an example.

The semiconductor substrate 110 may be formed of at least one of single crystal silicon and polycrystalline silicon containing impurities of a first conductive type. For example, the semiconductor substrate 110 may be formed of a single crystal silicon wafer.

In the embodiment disclosed herein, the first conductive type may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where the first conductive type is the n-type.

A front surface of the semiconductor substrate 110 may be an uneven surface having a plurality of uneven portions or having uneven characteristics. Thus, the emitter regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

The anti-reflection layer 130 may be positioned on the front surface of the semiconductor substrate 110, so as to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The tunnel layer 180 is disposed on an entire back surface of the semiconductor substrate 110 while directly contacting the entire back surface of the semiconductor substrate 110 and may include a dielectric material. Thus, as shown in FIGS. 2 and 3, the tunnel layer 180 may pass through carriers produced in the semiconductor substrate 110.

In other words, the tunnel layer 180 may pass through carriers produced in the semiconductor substrate 110 and may perform a passivation function with respect to the back surface of the semiconductor substrate 110.

The tunnel layer 180 may be formed of a dielectric material including silicon carbide (SiCx) or silicon oxide (SiOx) having strong durability at a high temperature equal to or higher than 600° C. Other materials may be used. For example, the tunnel layer 180 may be formed of silicon nitride (SiNx), hydrogenated SiNx, aluminum oxide (AlOx), silicon oxynitride (SiON), or hydrogenated SiON. A thickness of the tunnel layer 180 may be 0.5 nm to 2.5 nm.

The plurality of emitter regions 121 is disposed on the back surface of the semiconductor substrate 110, and more specifically directly contacts a portion of a back surface of the tunnel layer 180. The plurality of emitter regions 121 extends in the first direction x. The emitter regions 120 may be formed of polycrystalline silicon material of a second conductive type opposite the first conductive type. The emitter regions 120 may form a p-n junction together with the semiconductor substrate 110 with the tunnel layer 180 interposed therebetween.

Because each emitter region 121 forms the p-n junction together with the semiconductor substrate 110, the emitter region 121 may be of the p-type. However, if the semiconductor substrate 110 is of the p-type unlike the embodiment described above, the emitter region 121 may be of the n-type. In this instance, separated electrons may move to the plurality of emitter regions 121, and separated holes may move to the plurality of back surface field regions 172.

Returning to the embodiment of the invention, when the emitter region 121 is of the p-type, the emitter region 121 may be doped with impurities of a group III element such as B, Ga, and In. On the contrary, if the emitter region 121 is of the n-type, the emitter region 121 may be doped with impurities of a group V element such as P, As, and Sb.

The plurality of back surface field regions 172 is disposed on the back surface of the semiconductor substrate 110. More specifically, the plurality of back surface field regions 172 may directly contact a portion (separated from each of the plurality of emitter regions 121) of the back surface of the tunnel layer 180. The plurality of back surface field regions 172 may extend in the first direction x parallel to the plurality of emitter regions 121.

The back surface field regions 172 may be formed of polycrystalline silicon material more heavily doped than the semiconductor substrate 110 with impurities of the first conductive type. Thus, when the semiconductor substrate 110 is doped with, for example, n-type impurities, each of the plurality of back surface field regions 172 may be an $n^+$-type region.

A potential barrier is formed by a difference between impurity concentrations of the semiconductor substrate 110 and the back surface field regions 172. Hence, the back surface field regions 172 can prevent or reduce holes from moving to the back surface field regions 172 used as a moving path of electrons through the potential barrier and can make it easier for carriers (for example, electrons) to move to the back surface field regions 172.

Thus, the embodiment of the invention can reduce an amount of carriers lost by a recombination and/or a disappearance of electrons and holes at and around the back surface field regions 172 or at and around the first and second electrodes C141 and C142 and can accelerates a movement of electrons, thereby increasing an amount of electrons moving to the back surface field regions 172.

FIGS. 2 and 3 illustrate that the emitter regions 121 and the back surface field regions 172 are formed on the back surface of the tunnel layer 180 using polycrystalline silicon material, as an example. Unlike this, if the tunnel layer 180 is omitted, the emitter regions 121 and the back surface field regions 172 may be doped by diffusing impurities into the back surface of the semiconductor substrate 110. In this instance, the emitter regions 121 and the back surface field regions 172 may be formed of the same material as the semiconductor substrate 110, for example, single crystal silicon.

The intrinsic semiconductor layer 150 may be formed on the back surface of the tunnel layer 180 exposed between the emitter region 121 and the back surface field region 172. The intrinsic semiconductor layer 150 may be formed as an intrinsic polycrystalline silicon layer, that is not doped with impurities of the first conductive type or impurities of the second conductive type, unlike the emitter region 121 and the back surface field region 172.

Further, as shown in FIGS. 2 and 3, the intrinsic semiconductor layer 150 may be configured such that both sides directly contact the side of the emitter region 121 and the side of the back surface field region 172, respectively.

The passivation layer 190 removes a defect resulting from a dangling bond formed in a back surface of a polycrystalline silicon layer formed at the back surface field regions 172, the intrinsic semiconductor layers 150, and the emitter regions 121, and thus can prevent carriers produced in the semiconductor substrate 110 from being recombined and disappeared by the dangling bond.

For this, the passivation layer 190 may fully cover the back surface of the intrinsic semiconductor layer 150, cover a remaining portion excluding a portion connected to the first electrode C141 from a back surface of the emitter region 121, and cover a remaining portion excluding a portion connected to the second electrode C142 from a back surface of the back surface field region 172.

The passivation layer 190 may be formed of a dielectric material. For example, the passivation layer 190 may be formed of at least one of hydrogenated silicon nitride (SiNx:H), hydrogenated silicon oxide (SiOx:H), hydrogenated silicon nitride oxide (SiNxOy:H), hydrogenated silicon oxynitride (SiOxNy:H), and hydrogenated amorphous silicon (a-Si:H).

The first electrode C141 may be connected to the emitter region 121 and may extend in the first direction x. The first electrode C141 may collect carriers (for example, holes) moving to the emitter region 121.

The second electrode C142 may be connected to the back surface field region 172 and may extend in the first direction x in parallel with the first electrode C141. The second electrode C142 may collect carriers (for example, electrons) moving to the back surface field region 172.

As shown in FIG. 1, the first and second electrodes C141 and C142 may extend in the first direction x and may be alternately disposed in the second direction y.

As shown in FIG. 3, a thickness TE1 of the first electrode C141 may be substantially equal to a thickness TE2 of the second electrode C142. A height HE1 from the back surface of the semiconductor substrate 110 to a back surface of the first electrode C141 may be substantially equal to a height HE2 from the back surface of the semiconductor substrate 110 to a back surface of the second electrode C142.

The first and second electrodes C141 and C142 may include a metal material different from the conductive line and the conductive adhesive CA. For example, each of the first and second electrodes C141 and C142 may be formed as at least one layer including at least one of titanium (Ti), silver (Ag), aluminum (Al), nickel-vanadium (NiV) alloy, nickel (Ni), nickel-aluminum (NixAly) alloy, molybdenum (Mo), or tin (Sn).

The first and second electrodes C141 and C142 may be formed using one of a sputtering method, an electron beam evaporator, an electroless plating method, and an electroplating method.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 2 and 3. The components of the solar cell may be variously changed, except that the first and second electrodes C141 and C142 included in the solar cell are formed on the back surface of the semiconductor substrate 110.

For example, the solar cell module according to the embodiment of the invention may use a metal wrap through (MWT) solar cell, that is configured such that a portion of the first electrode C141 and a portion of the emitter region 121 are positioned on the front surface of the semiconductor substrate 110, and the portion of the first electrode C141 is connected to a remaining portion of the first electrode C141 formed on the back surface of the semiconductor substrate 110 through a hole of the semiconductor substrate 110.

Figure 4:
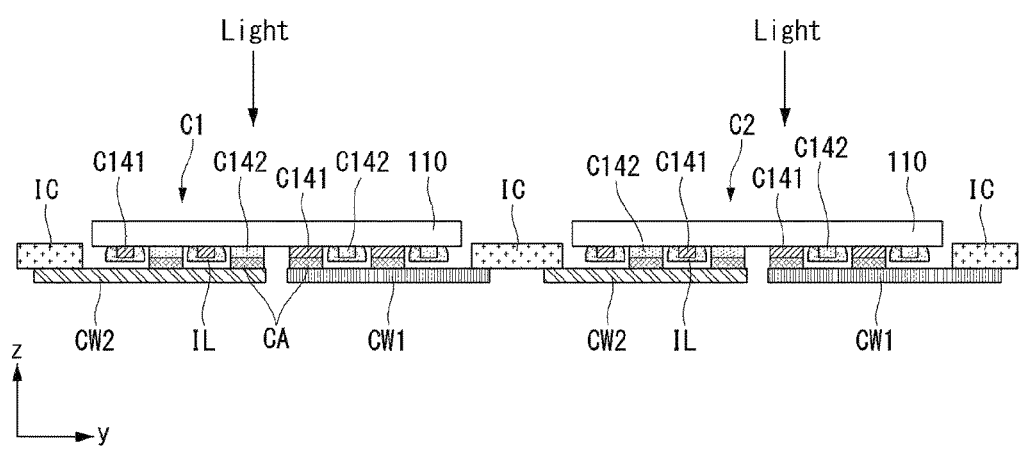
FIG. 4 is a cross-sectional view taken along line csx1-csx1 of FIG. 1.

FIG. 4 illustrates a cross-sectional structure, in which the plurality of solar cells each having above-described configuration are connected in series using the conductive lines and the intercell connector as shown in FIG. 1.

More specifically, FIG. 4 is a cross-sectional view taken along line csx1-csx1 of FIG. 1.

As shown in FIG. 4, a plurality of solar cells including a first solar cell C1 and a second solar cell C2 may be arranged in the second direction y.

A longitudinal direction of a plurality of first and second electrodes C141 and C142 included in the first and second solar cells C1 and C2 may correspond to the first direction x.

The first and second solar cells C1 and C2, that are arranged in the second direction y, may be connected in series to each other in the second direction y using first and second conductive lines CW1 and CW2 and an intercell connector IC to form a string.

The first and second conductive lines CW1 and CW2 and the intercell connector IC may be formed of a conductive metal material. The first and second conductive lines CW1 and CW2 may be connected to a back surface of a semiconductor substrate 110 of each solar cell and then may be connected to the intercell connector IC for a serial connection of the solar cells.

Each of the first and second conductive lines CW1 and CW2 may have a conductive wire shape having a circular cross section or a ribbon shape, in which a width is greater than a thickness.

More specifically, the plurality of first conductive lines CW1 may overlap the plurality of first electrodes C141 included in each of the first and second solar cells C1 and C2 and may be connected to the plurality of first electrodes C141 through a conductive adhesive CA. Further, the plurality of first conductive lines CW1 may be insulated from the plurality of second electrodes C142 included in each of the first and second solar cells C1 and C2 through an insulating layer IL formed of an insulating material.

In this instance, as shown in FIGS. 1 and 4, each of the plurality of first conductive lines CW1 may protrude to the outside of the semiconductor substrate 110 toward the intercell connector IC disposed between the first and second solar cells C1 and C2.

The plurality of second conductive lines CW2 may overlap the plurality of second electrodes C142 included in each of the first and second solar cells C1 and C2 and may be connected to the plurality of second electrodes C142 through a conductive adhesive CA. Further, the plurality of second conductive lines CW2 may be insulated from the plurality of first electrodes C141 included in each of the first and second solar cells C1 and C2 through an insulating layer IL formed of an insulating material.

In this instance, as shown in FIGS. 1 and 4, each of the plurality of second conductive lines CW2 may protrude to the outside of the semiconductor substrate 110 toward the intercell connector IC disposed between the first and second solar cells C1 and C2.

The conductive adhesive CA may be formed of a metal material including tin (Sn) or Sn-containing alloy. The conductive adhesive CA may be formed as one of a solder paste including Sn or Sn-containing alloy, an epoxy solder paste, in which Sn or Sn-containing alloy is included in an epoxy, and a conductive paste.

For example, when the conductive adhesive CA is formed as the solder paste, the solder paste may include at least one metal material of Sn, SnBi, SnIn, SnAgCu, SnPb, SnBi-CuCo, SnBiAg, SnPbAg, or SnAg. When the conductive adhesive CA is formed as the epoxy solder paste, the epoxy solder paste may be formed by including at least one metal material of Sn, SnBi, SnIn, SnAgCu, SnPb, SnBiCuCo, SnBiAg, SnPbAg, or SnAg in an epoxy resin.

Further, when the conductive adhesive CA is formed as the conductive paste, the conductive paste may be formed by including at least one metal material of Sn, SnBi, Ag, AgIn, or AgCu in a resin, for example, an epoxy.

The insulating layer IL may be made of any material as long as an insulating material is used. For example, the insulating layer IL may use one insulating material of an epoxy-based resin, polyimide, polyethylene, an acrylic-based resin, and a silicone-based resin.

As shown in FIGS. 1 and 4, a portion protruding to the outside of the semiconductor substrate 110 in each of the first and second conductive lines CW1 and CW2 connected to the back surface of each solar cell may be connected to the back surface of the intercell connector IC between the first and second solar cells C1 and C2. Hence, the plurality of solar cells C1 and C2 may be connected in series to each other in the second direction y to form one string.

In the solar cell module having the above-described configuration, when a bad connection between the first and second conductive lines CW1 and CW2 and the first and second electrodes C141 and C142 is generated in the plurality of solar cells, the first and second conductive lines CW1 and CW2 of a solar cell having the bad connection may be disconnected from the intercell connector IC. Hence, only the bad solar cell can be easily replaced.

A thickness of the conductive adhesive CA and a thickness of the insulating layer IL are described in detail below.

Figure 5:
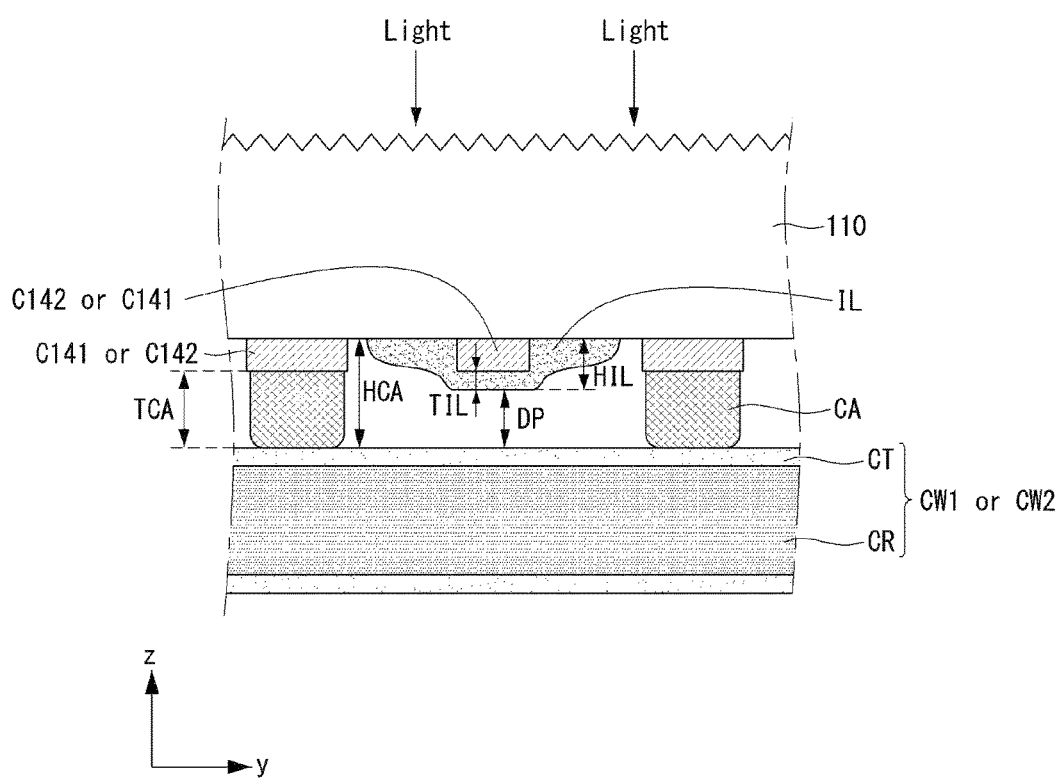
FIG. 5 illustrates in detail a thickness of a conductive adhesive and a thickness of an insulating layer.
Figure 6:
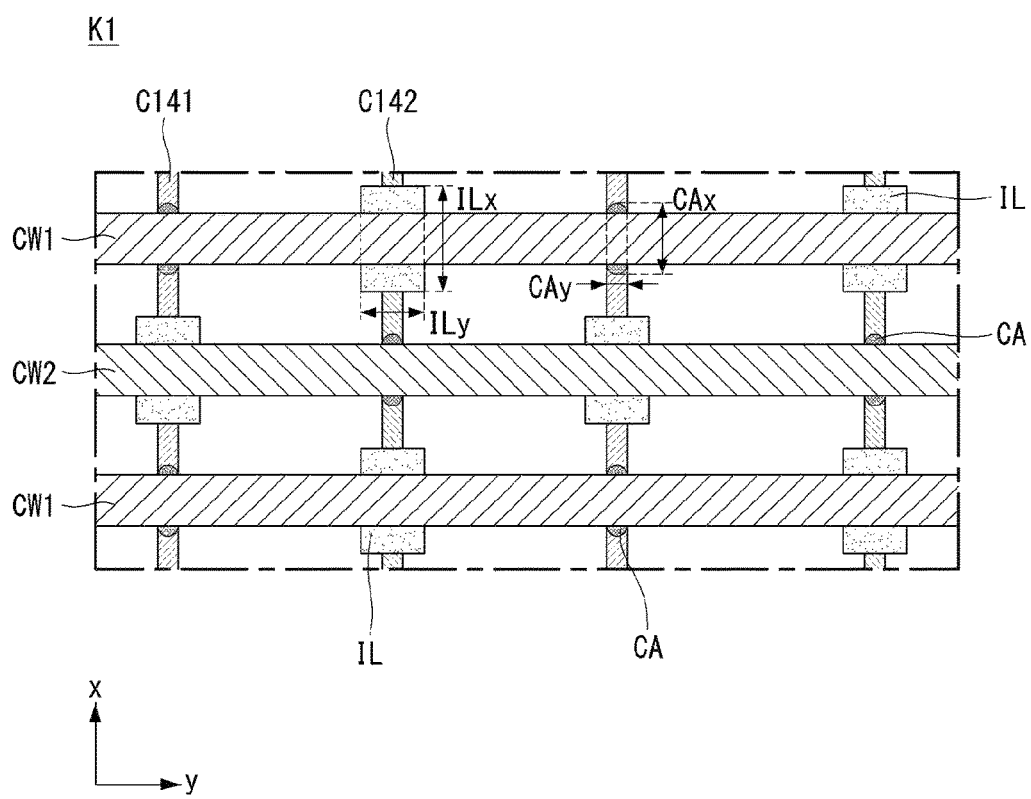
FIG. 6 enlargedly illustrates a portion K1 of FIG. 1 so as to explain a plane shape of a conductive adhesive and an insulating layer.

FIG. 5 illustrates in detail a thickness of a conductive adhesive and a thickness of an insulating layer. FIG. 6 enlargedly illustrates a portion K1 of FIG. 1 so as to explain a plane shape of a conductive adhesive and an insulating layer.

In the solar cell module according to the embodiment of the invention, a thickness TCA of a conductive adhesive CA between an electrode and a conductive line may be greater than a thickness TIL of an insulating layer IL between an electrode and a conductive line.

Further, a height HCA from the back surface of the first and second electrodes C141 and C142 to a back surface of the conductive adhesive CA may be greater than a height HIL from the back surface of the first and second electrodes C141 and C142 to a back surface of the insulating layer IL.

When the first and second electrodes C141 and C142 have the same thickness, the height HCA from the back surface of the semiconductor substrate 110 to the back surface of the conductive adhesive CA positioned on the first and second electrodes C141 and C142 may be greater than the height HIL from the back surface of the semiconductor substrate 110 to the back surface of the insulating layer IL positioned on the first and second electrodes C141 and C142.

Unlike FIG. 5, when the back surface of the conductive adhesive CA or the back surface of the insulating layer IL is not flat, the height HCA of the conductive adhesive CA may be a maximum height among heights from the back surface of the first and second electrodes C141 and C142 to the back surface of the conductive adhesive CA. Further, the height HIL of the insulating layer IL may be a maximum height among heights from the back surface of the first and second electrodes C141 and C142 to the back surface of the insulating layer IL.

For example, the conductive adhesive CA may be positioned between the first electrode C141 and the first conductive line CW1 or between the second electrode C142 and the second conductive line CW2. The insulating layer IL may be positioned between the first electrode C141 and the second conductive line CW2 or between the second electrode C142 and the first conductive line CW1.

In this instance, the thickness TCA of the conductive adhesive CA applied between the first electrode C141 and the first conductive line CW1 may be greater than the thickness TIL of the insulating layer IL applied between the second electrode C142 and the first conductive line CW1. On the contrary, the thickness TCA of the conductive adhesive CA applied between the second electrode C142 and the second conductive line CW2 may be greater than the thickness TIL of the insulating layer IL applied between the first electrode C141 and the second conductive line CW2.

As shown in FIG. 5, because a distance between the electrodes C141 and C142 and the conductive lines CW1 and CW2 is substantially equal to the thickness TCA of the conductive adhesive CA, the insulating layer IL may be separated from the conductive lines CW1 and CW2 by a predetermined distance DP.

As shown in FIG. 6, the conductive adhesive CA is not positioned in an area, in which the first and second electrodes C141 and C142 are not formed in the back surface of the semiconductor substrate 110. The conductive adhesive CA may be positioned only on one electrode, so that it covers only a portion of the electrode overlapping the conductive line.

Namely, the conductive adhesive CA may be positioned only on a portion of the first electrode C141 connected to the first conductive line CW1 or may be positioned only on a portion of the second electrode C142 connected to the second conductive line CW2.

However, the insulating layer IL may be positioned on not only a portion of the second electrode C142 crossing and overlapping the first conductive line CW1 but also the back surface of the semiconductor substrate 110 around the portion of the second electrode C142. Further, the insulating layer IL may be positioned on not only a portion of the first electrode C141 crossing and overlapping the second conductive line CW2 but also the back surface of the semiconductor substrate 110 around the portion of the first electrode C141.

For example, the average thickness TCA of the conductive adhesive CA positioned on the first and second electrodes C141 and C142 may be in a range of two to ten times the average thickness TIL of the insulating layer IL positioned on the first and second electrodes C141 and C142.

The thickness TIL of the insulating layer IL indicates a thickness TIL of the insulating layer IL positioned on a portion of the first and second electrodes C141 and C142 crossing the first and second conductive lines CW1 and CW2.

For example, the average thickness TIL of the insulating layer IL may be 1 μm to 50 μm. The average thickness TCA of the conductive adhesive CA may be 10 μm to 100 μm in a range of two to ten times the average thickness TIL of the insulating layer IL.

Further, an area of the insulating layer IL may be greater than an area of the conductive adhesive CA.

More specifically, as shown in FIG. 6, the conductive adhesive CA may be positioned on the first and second electrodes C141 and C142 at crossings of the first and second electrodes C141 and C142 and the first and second conductive lines CW1 and CW2 along the longitudinal direction of the first and second electrodes C141 and C142.

A width CAx of the conductive adhesive CA in the first direction x may be equal to or greater than a width of each of the first and second conductive lines CW1 and CW2 and may be equal to or less than 1.2 times the width of each of the first and second conductive lines CW1 and CW2.

Further, a width CAy of the conductive adhesive CA in the second direction y may be equal to or less than a width of each of the first and second electrodes C141 and C142.

However, the insulating layer IL may be positioned on not only a portion of the first and second electrodes C141 and C142 crossing the first and second conductive lines CW1 and CW2 but also the back surface of the semiconductor substrate 110 around the portion of the first and second electrodes C141 and C142, so as to more surely insulate the first and second electrodes C141 and C142 from the first and second conductive lines CW1 and CW2.

A width ILx of the insulating layer IL in the first direction x may be greater than the width CAx of the conductive adhesive CA in the first direction x and may be less than three times a width of each of the first and second conductive lines CW1 and CW2.

A width ILy of the insulating layer IL in the second direction y may be greater than a width of each of the first and second electrodes C141 and C142 and may be less than a distance between the two separated first electrodes C141 or a distance between the two separated second electrodes C142.

Hence, the insulating layer IL can prevent short circuit between the electrodes C141 and C142 and the conductive lines CW1 and CW2, which have to be insulated from each other in the solar cell module, and can further improve durability of the solar cell module.

Each of the first and second conductive lines CW1 and CW2 may include a core CR and a coating layer CT coated on a surface of the core CR.

The core CR may be formed using at least one of copper (Cu) and aluminum (Al). The coating layer CT may be formed using tin (Sn). For example, the coating layer CT may be formed using at least one of SnPb, SnAgCu, SnBiAg, SnBi, Sn or SnAg.

A thickness of the core CR may be in a range of 50 µm to 250 µm, and a thickness of the coating layer CT may be in a range of 1 µm to 30 µm.

In the solar cell module according to the embodiment of the invention, an encapsulant may be filled in a separation space between the insulating layer IL and the conductive line in a lamination process for encapsulating the plurality of solar cells. This is described in detail below.

Figure 7:
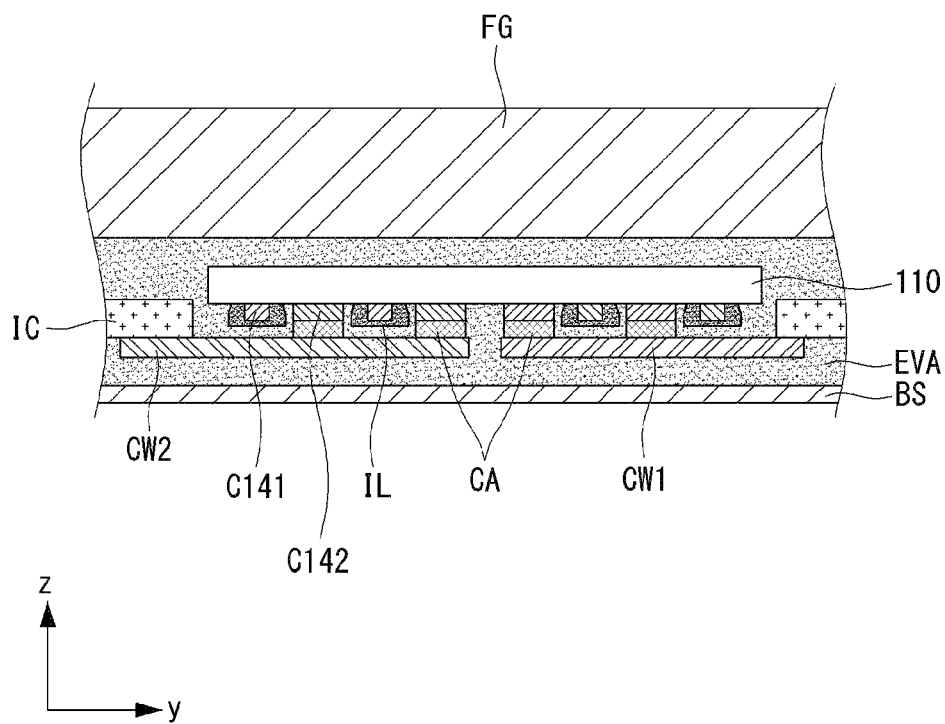
FIG. 7 is a cross-sectional view of a solar cell module according to an embodiment of the invention encapsulated through a lamination process.
Figure 8:
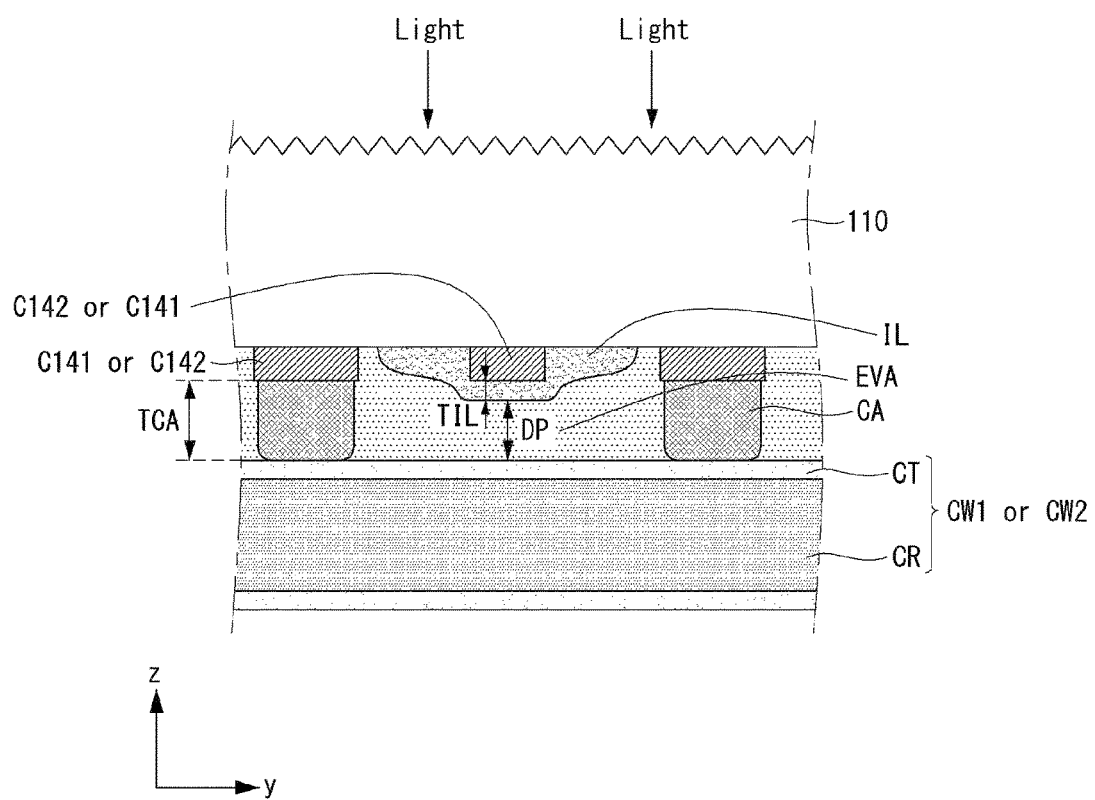
FIG. 8 illustrates in detail a structure, in which an encapsulant is filled in a separation space between an insulating layer and a conductive line through a lamination process.

FIG. 7 is a cross-sectional view of a solar cell module according to an embodiment of the invention encapsulated through a lamination process. FIG. 8 illustrates in detail a structure, in which an encapsulant is filled in a separation space between an insulating layer and a conductive line through a lamination process.

As shown in FIG. 7, a plurality of solar cells may be integrated and encapsulated through a lamination process for simultaneously applying heat and pressure to the solar cells in a state where the solar cells are disposed between a front transparent substrate FG and a back sheet BS.

The front transparent substrate FG may be formed of a tempered glass having a high transmittance and an excellent damage prevention function.

The back sheet BS prevents moisture and oxygen from penetrating into back surfaces of the solar cells and can protect the solar cells from an external environment. The back sheet BS may have a multi-layered structure including a moisture/oxygen penetrating prevention layer, a chemical corrosion prevention layer, etc.

The back sheet BS may be formed as a thin sheet including an insulating material, for example, fluoropolymer/polyester/fluoropolymer (FP/PE/FP). Other insulating materials may be used.

The lamination process may be performed in a state where a sheet type encapsulant EVA is disposed between the front transparent substrate FG and the solar cells and between the solar cells and the back sheet BS.

The encapsulant EVA may use a different material from the insulating layer IL. The encapsulant EVA may be formed of a material, for example, ethylene vinyl acetate (EVA) capable of preventing corrosion resulting from the moisture penetration, protecting the solar cells from an impact, and absorbing the impact.

Thus, as shown in FIG. 8, the sheet type encapsulant EVA disposed between the front transparent substrate FG and the solar cells and between the solar cells and the back sheet BS may be melted by the heat and the pressure during the lamination process and may be filled in an empty space between the first and second electrodes C141 and C142, an empty space between the first and second conductive lines CW1 and CW2, and a separation space between the insulating layer IL and the first and second conductive lines CW1 and CW2.

Hence, durability of the solar cell module can be further improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells, each of the plurality of solar cells including a semiconductor substrate doped with impurities of a first conductive type, and light being incident on a front surface of the semiconductor substrate;
an emitter region positioned at a back surface of the semiconductor substrate opposite the front surface and doped with impurities of a second conductive type opposite the first conductive type;
a back surface field region positioned at the back surface of the semiconductor substrate and more heavily doped than the semiconductor substrate with the impurities of the first conductive type;
a first electrode connected to the emitter region;
a second electrode connected to the back surface field region; and
a conductive line connected to a back surface of one electrode of the first electrode and the second electrode using a conductive adhesive and insulated from a back surface of the other electrode of the first electrode and the second electrode through an insulating layer, the conductive line being used to connect the plurality of solar cells in series,
wherein a thickness of the conductive adhesive at between the back surface of the one electrode and a front surface of the conductive line is greater than a thickness of the insulating layer at between the back surface of the other electrode and the front surface of the conductive line,
wherein the insulating layer and the front surface of the conductive line are spaced apart from each other, and
wherein a height between the back surface of the semiconductor substrate and a back surface of the conductive adhesive facing the conductive line is greater than a height between the back surface of the semiconductor substrate and a back surface of the insulating layer facing the conductive line.

2. The solar cell module of claim 1, wherein an encapsulant is positioned in a separation space between the insulating layer and the front surface of the conductive line and protects the semiconductor substrate from an external impact.

3. The solar cell module of claim 2, wherein the insulating layer includes at least one from the group consisting of epoxy, polyimide, and silicone.

4. The solar cell module of claim 3, wherein a material of the encapsulant is different from a material of the insulating layer, and the encapsulant and the insulating layer are positioned between adjacent conductive adhesives.

5. The solar cell module of claim 3, wherein the encapsulant includes ethylene vinyl acetate (EVA).

6. The solar cell module of claim 1, wherein a material of the conductive adhesive includes tin (Sn).

7. The solar cell module of claim 6, wherein the conductive adhesive includes one of a solder paste, an epoxy solder paste, and a conductive paste.

8. The solar cell module of claim 1, wherein each of the first and second electrodes includes a metal material different from the conductive adhesive.

9. The solar cell module of claim 8, wherein each of the first and second electrodes is formed as at least one layer including at least one of titanium (Ti), silver (Ag), aluminum (Al), nickel-vanadium (NiV) alloy, nickel (Ni), nickel-aluminum (NixAly) alloy, molybdenum (Mo), and tin (Sn).

10. The solar cell module of claim 1, wherein the conductive line includes:
a core including at least one of copper (Cu) and aluminum (Al); and
a coating layer coated on a surface of the core, the coating layer including tin (Sn).

11. The solar cell module of claim 10, wherein the coating layer includes at least one from the group consisting of SnPb, SnAgCu, SnBiAg, SnBi, Sn and SnAg.

12. The solar cell module of claim 10, wherein a thickness of the core is 50 µm to 250 µm, and a thickness of the coating layer is 1 µm to 30 µm.

13. The solar cell module of claim 1, wherein the thickness of the conductive adhesive is 10 µm to 100 µm, and the thickness of the insulating layer is 1 µm to 50 µm.

14. The solar cell module of claim 1, wherein the conductive adhesive and the insulating layer are not in contact.

15. A solar cell module comprising:
a plurality of solar cells, each of the plurality of solar cells including a semiconductor substrate doped with impurities of a first conductive type, and light being incident on a front surface of the semiconductor substrate;
an emitter region positioned at a back surface of the semiconductor substrate opposite the front surface and doped with impurities of a second conductive type opposite the first conductive type;
a back surface field region positioned at the back surface of the semiconductor substrate and more heavily doped than the semiconductor substrate with the impurities of the first conductive type;
a first electrode connected to the emitter region;
a second electrode connected to the back surface field region; and
a conductive line connected to one electrode of the first electrode and the second electrode using a conductive adhesive and insulated from the other electrode of the first electrode and the second electrode through an insulating layer, the conductive line being used to connect the plurality of solar cells in series,
wherein the insulating layer and a front surface of the conductive line are spaced apart from each other, and
wherein a height between the back surface of the semiconductor substrate and a back surface of the conductive adhesive facing the conductive line is greater than a height between the back surface of the semiconductor substrate and a back surface of the insulating layer facing the conductive line.

16. The solar cell module of claim 15, wherein an encapsulant is disposed between the insulating layer and the conductive line, and the encapsulant and the insulating layer are positioned between adjacent conductive adhesives.

17. The solar cell module of claim 15, wherein a thickness of the conductive adhesive between the one electrode and the conductive line is greater than a thickness of the insulating layer between the other electrode and the conductive line.

18. The solar cell module of claim 15, wherein the conductive adhesive and the insulating layer are not in contact.

* * * * *